(12) United States Patent
Tsuda (10) Patent No.: US 12,412,816 B2
(45) Date of Patent: Sep. 9, 2025

(54) POWER SEMICONDUCTOR MODULE, POWER CONVERSION APPARATUS, AND MOVING BODY

(71) Applicant: Mitsubishi Electric Corporation, Tokyo (JP)

(72) Inventor: Ryo Tsuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 521 days.

(21) Appl. No.: 17/753,291

(22) PCT Filed: Dec. 10, 2019

(86) PCT No.: PCT/JP2019/048279
§ 371 (c)(1),
(2) Date: Feb. 25, 2022

(87) PCT Pub. No.: WO2021/117129
PCT Pub. Date: Jun. 17, 2021

(65) Prior Publication Data
US 2022/0301999 A1 Sep. 22, 2022

(51) Int. Cl.
*H01L 23/498* (2006.01)
*H01L 23/00* (2006.01)
(Continued)

(52) U.S. Cl.
CPC .. *H01L 23/49811* (2013.01); *H01L 23/49822* (2013.01); *H01L 23/49844* (2013.01);
(Continued)

(58) Field of Classification Search
CPC ..... H01L 23/49811; H01L 24/32; H01L 24/29
See application file for complete search history.

(56) References Cited

U.S. PATENT DOCUMENTS 5,006,953 A * 4/1991 Hirama ................. H01G 4/242
361/309
6,088,234 A * 7/2000 Ishikawa ............. H05K 1/0201
337/402
(Continued)

FOREIGN PATENT DOCUMENTS

CN 107039297 A 8/2017
DE 10 2017 200 256 A1 8/2017
(Continued)

OTHER PUBLICATIONS

Toshiba, "Power MOSFET Electrical Characteristics" (2023): pp. 1-12. (Retrieved from https://toshiba.semicon-storage.com/info/application_note_en_20230209_AKX00063.pdf?did=13415) (Year: 2023).*

(Continued)

*Primary Examiner* — Michele Fan
(74) *Attorney, Agent, or Firm* — Studebaker Brackett PLLC (57) ABSTRACT

An insulated substrate (2) includes first and second circuit patterns (5,4). A semiconductor device (7) includes first and second main electrodes (9,8) connected to the first and second circuit patterns (5,4) respectively and through which main currents flow. A first lead (12) is solder jointed to the first circuit pattern (5). A second lead (11) is ultrasonic jointed to the second circuit pattern (4).

8 Claims, 5 Drawing Sheets

(51) Int. Cl.
  *B60L 9/00* (2019.01)
  *H02M 1/08* (2006.01)
  *H02M 7/00* (2006.01)

(52) U.S. Cl.
  CPC .............. *H01L 24/32* (2013.01); *B60L 9/00* (2013.01); *B60L 2200/26* (2013.01); *B60L 2210/40* (2013.01); *H01L 24/45* (2013.01); *H01L 24/48* (2013.01); *H01L 24/73* (2013.01); *H01L 2224/32225* (2013.01); *H01L 2224/32245* (2013.01); *H01L 2224/45124* (2013.01); *H01L 2224/45147* (2013.01); *H01L 2224/48145* (2013.01); *H01L 2224/73265* (2013.01); *H01L 2924/13055* (2013.01); *H01L 2924/35121* (2013.01); *H02M 1/08* (2013.01); *H02M 7/003* (2013.01)

(56) References Cited

U.S. PATENT DOCUMENTS

| | | | |
|---|---|---|---|
| 2001/0039724 A1* | 11/2001 | Ohshima | H05K 1/141 29/874 |
| 2013/0069215 A1* | 3/2013 | Nakao | H01L 23/3735 257/687 |
| 2013/0307132 A1* | 11/2013 | Kawabata | H01L 23/49541 257/676 |
| 2017/0062386 A1* | 3/2017 | Wang | H01L 24/19 |
| 2017/0221853 A1 | 8/2017 | Yoneyama et al. | |
| 2017/0288564 A1 | 10/2017 | Ishii et al. | |
| 2019/0143434 A1* | 5/2019 | Yoneda | H01L 23/53214 257/741 |
| 2019/0326262 A1* | 10/2019 | Tanaka | H01L 23/49822 |

FOREIGN PATENT DOCUMENTS

| | | |
|---|---|---|
| DE | 10 2017 106 174 A1 | 10/2017 |
| JP | 2007-109880 A | 4/2007 |
| JP | 2009-004435 A | 1/2009 |
| JP | 2011-004502 A | 1/2011 |
| JP | 2017-028159 A | 2/2017 |
| JP | 2017-139304 A | 8/2017 |
| JP | 2019-145475 A | 8/2019 |
| WO | WO-2010016426 A1 * 2/2010 ............. B60K 6/445 |

OTHER PUBLICATIONS

An Office Action; "Notice of Reasons for Refusal," mailed by the Japanese Patent Office on Oct. 4, 2022, which corresponds to Japanese Patent Application No. 2021-563487 and is related to U.S. Appl. No. 17/753,291; with English language translation.

International Search Report issued in PCT/JP2019/048279; mailed Mar. 10, 2020.

An Office Action; "Notice of Reasons for Refusal," mailed by the Japanese Patent Office on Feb. 14, 2023, which corresponds to Japanese Patent Application No. 2021-563487 and is related to U.S. Appl. No. 17/753,291; with English language translation.

An Office Action mailed by China National Intellectual Property Administration on Aug. 17, 2024, which corresponds to Chinese Patent Application No. 201980102719.7 and is related to U.S. Appl. No. 17/753,291; with English language translation.

Office Action issued in DE 11 2019 007 957.3; mailed by the German Patent and Trademark Office on Jan. 2, 2025.

* cited by examiner

POWER SEMICONDUCTOR MODULE, POWER CONVERSION APPARATUS, AND MOVING BODY

FIELD

The present disclosure relates to a power semiconductor module, a power conversion apparatus, and a moving body.

BACKGROUND

In related art, solder joint is used as jointing of terminals within a semiconductor module. However, there has been a problem that solder joint makes high-temperature operation of the semiconductor module difficult and lowers life with respect to a heat cycle. To solve this problem, ultrasonic jointing is used as jointing of terminals within the module (see, for example, PTL 1). Further, to improve energization performance of a main current path within the module, application of direct lead bonding (DLB), or the like, in place of wire bonding has been underway.

CITATION LIST

Patent Literature

[PTL 1] JP 2007-109880 A

SUMMARY

Technical Problem

Bondability and energization performance are improved in a semiconductor module in which ultrasonic jointing is used in all jointed portions. However, in a case where a chip within the module is broken due to some reasons and an internal circuit is shorted, an overcurrent which is larger than a current in the semiconductor module in which solder joint is used flows, which may make a scale of breakage inside the module larger.

The present invention has been made to solve the problem as described above and is directed to providing a semiconductor module which enables high-temperature operation and which is capable of preventing lowering of life with respect to a heat cycle while having capabilities of cutting off an overcurrent, a power conversion apparatus and a moving body.

Solution to Problem

A semiconductor module according to the present disclosure includes: an insulated substrate including first and second circuit patterns; a semiconductor device including first and second main electrodes connected to the first and second circuit patterns respectively and through which main currents flow; a first lead solder jointed to the first circuit pattern; and a second lead ultrasonic jointed to the second circuit pattern.

Advantageous Effects of Invention

In the present disclosure, the first lead is solder jointed to the circuit pattern through which the main current flows. In a case where a large current flows due to breakage inside the module, the solder melts and the first lead is separated from the circuit pattern. By this means, an overcurrent can be cut off. Further, ultrasonic jointing of the second lead can reduce portions of solder joint. This enables high-temperature operation and can prevent lowering of life with respect to a heat cycle.

DESCRIPTION OF EMBODIMENTS

A semiconductor module, a power conversion apparatus, and a moving body according to the embodiments of the present disclosure will be described with reference to the drawings. The same components will be denoted by the same symbols, and the repeated description thereof may be omitted.

Embodiment 1

Figure 1:
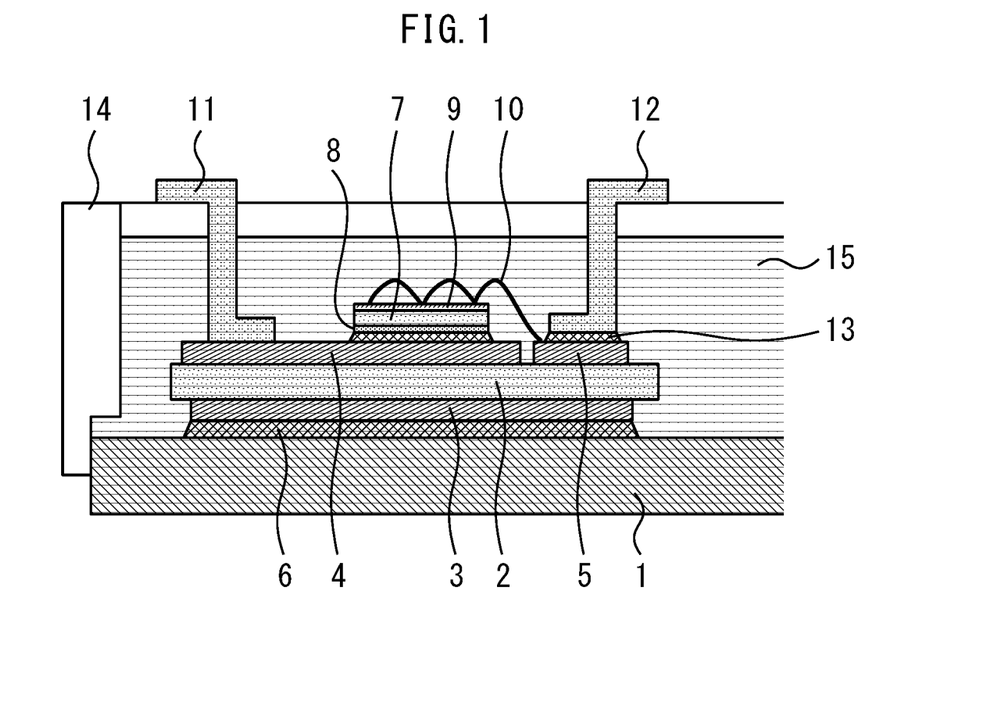
FIG. 1 is a cross-sectional view illustrating a semiconductor module according to Embodiment 1.

FIG. 1 is a cross-sectional view illustrating a semiconductor module according to Embodiment 1. An insulated substrate 2 is provided on a base plate 1. A lower electrode 3 is provided on a lower surface of the insulated substrate 2, and circuit patterns 4 and 5 are provided on an upper surface of the insulated substrate 2. The lower electrode 3 is jointed to the base plate 1 with solder 6.

A semiconductor device 7 is provided on the circuit pattern 4. Here, the semiconductor device 7 is an IGBT and has a lower surface on which a collector electrode 8 is provided and an upper surface on which an emitter electrode 9 and a gate electrode (not illustrated) are provided. The collector electrode 8 on the lower surface of the semiconductor device 7 is solder jointed to the circuit pattern 4. The emitter electrode 9 on the upper surface of the semiconductor device 7 is connected to the circuit pattern 5 with an Al or Cu wire 10. The collector electrode 8 and the emitter electrode 9 are main electrodes through which main currents flow.

A lead 11 is ultrasonic jointed to the circuit pattern 4. A lead 12 is jointed to the circuit pattern 5 with solder 13. A main current is drawn outside the module by the leads 11 and 12. A case 14 is provided on an outer periphery of the base plate 1 so as to surround the insulated substrate 2, the semiconductor device 7 and the leads 11 and 12. Inside of the case 14 is sealed with a seal material 15.

In the present embodiment, the lead 12 is solder jointed to the circuit pattern 5 through which the main current flows. In a case where a large current flows due to breakage inside the module, the solder 13 melts and the lead 12 is separated from the circuit pattern 5. In this state where the lead 12 is separated from the circuit pattern 5, the lead 12 is supported by the case 14. Further, the seal material 15 is not a complete liquid, and thus, the seal material 15 can also support the lead 12 in a short period during which at least an overcurrent flows. By this means, an overcurrent can be cut off. Further, ultrasonic jointing of the lead 11 can reduce portions of solder joint. This enables high-temperature operation and can prevent lowering of life with respect to a heat cycle.

Note that the semiconductor device 7 may be a MOSFET, in which case, the collector electrode 8 becomes a drain electrode, and the emitter electrode 9 becomes a source electrode. Further, a lead is also connected to the gate electrode of the semiconductor device 7. Such a lead other than the main current path is not solder jointed, but ultrasonic jointed to the circuit pattern of the insulated substrate 2.

Embodiment 2

Figure 2:
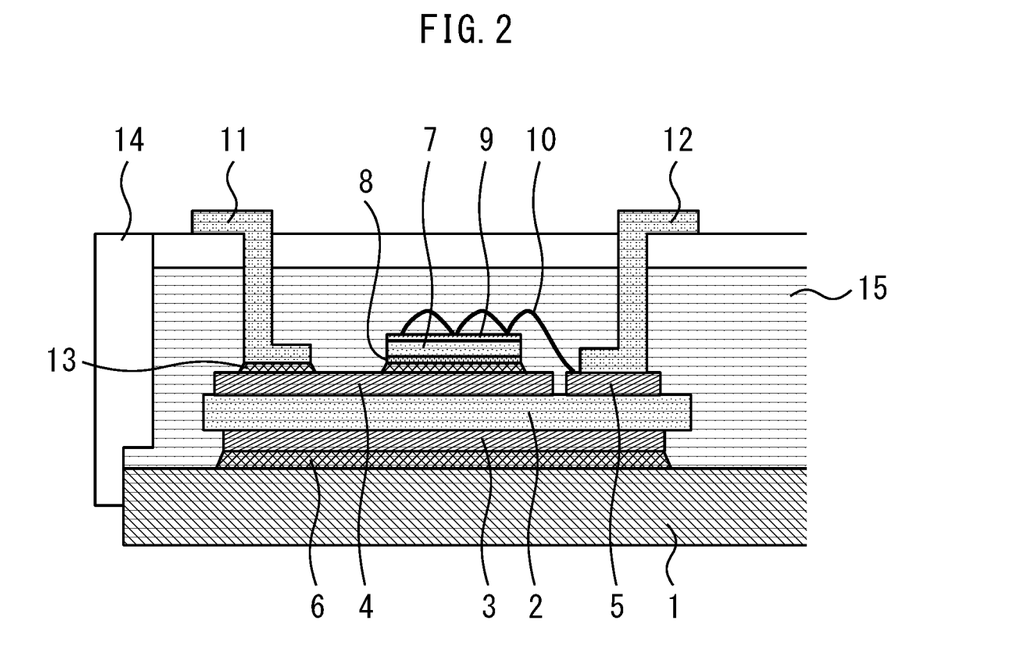
FIG. 2 is a cross-sectional view illustrating a semiconductor module according to Embodiment 2.

FIG. 2 is a cross-sectional view illustrating a semiconductor module according to Embodiment 2. The lead 11 which is a high-voltage side terminal is jointed to the circuit pattern 4 with the solder 13. The lead 12 which is a low-voltage side terminal is ultrasonic jointed to the circuit pattern 5. The high-voltage side terminal is solder jointed, so that it is possible to cut off an overcurrent to be generated between the high-voltage side terminal and the base plate 1 as well as an overcurrent to be generated between the high-voltage side terminal and the low-voltage side terminal. As a result, it is possible to prevent a failure mode such as a ground fault. Other configurations and effects are similar to those in Embodiment 1.

Embodiment 3

Figure 3:
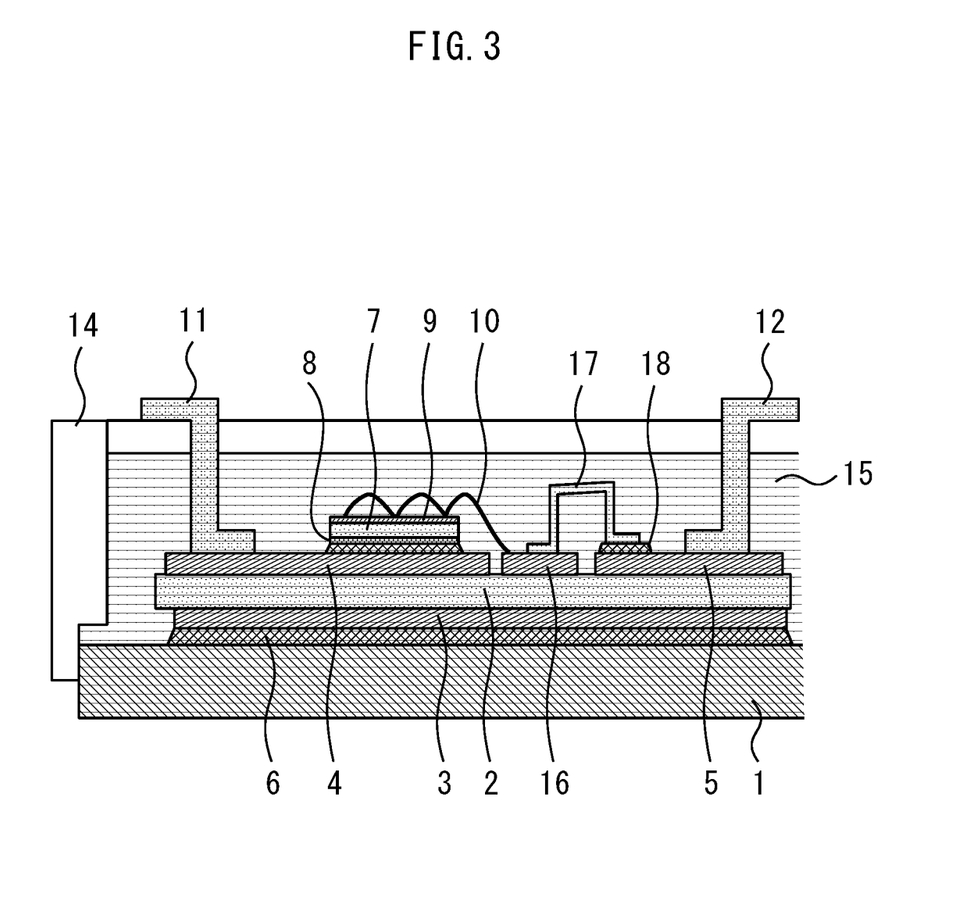
FIG. 3 is a cross-sectional view illustrating a semiconductor module according to Embodiment 3.

FIG. 3 is a cross-sectional view illustrating a semiconductor module according to Embodiment 3. A circuit pattern 16 is further provided on the upper surface of the insulated substrate 2. The lead 11 is ultrasonic jointed to the circuit pattern 4, and the lead 12 is ultrasonic jointed to the circuit pattern 5. The emitter electrode 9 of the semiconductor device 7 is connected to the circuit pattern 16 with the wire 10. One end of the U-shaped lead 17 is jointed to the circuit pattern 5 with solder 18, and the other end is ultrasonic jointed to the circuit pattern 16. Other configurations are similar to those in Embodiment 1.

Figure 4:
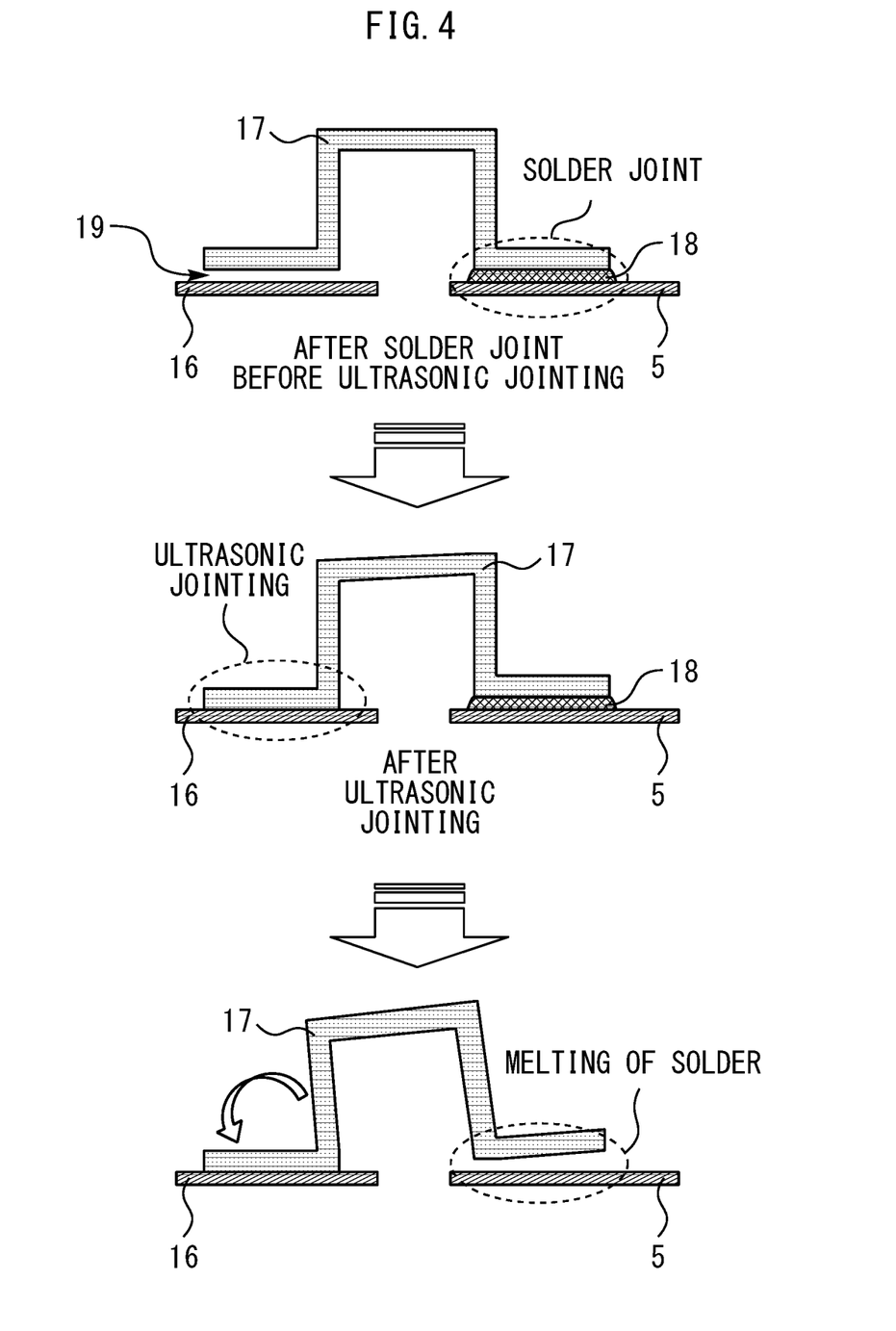
FIG. 4 is a cross-sectional view illustrating aspect of jointing of the U-shaped lead and melting of solder.

FIG. 4 is a cross-sectional view illustrating aspect of jointing of the U-shaped lead and melting of solder. First, one end of the U-shaped lead 17 is solder jointed to the circuit pattern 5. In this state, a gap 19 exists between the other end of the lead 17 and the circuit pattern 16. Then, the other end of the lead 17 is ultrasonic jointed to the circuit pattern 16. Upon this ultrasonic jointing, the lead 17 is plastically deformed so as to eliminate the gap 19 and generates residual stress inside the lead 17. When the solder 18 melts, one end of the lead 17 is peeled from the circuit pattern 5 by the residual stress. This can cut off an overcurrent.

Further, it is possible to reduce portions of solder joint by ultrasonic jointing the other end of the lead 17. This enables high-temperature operation and can prevent lowering of life with respect to a heat cycle.

Embodiment 4

Figure 5:
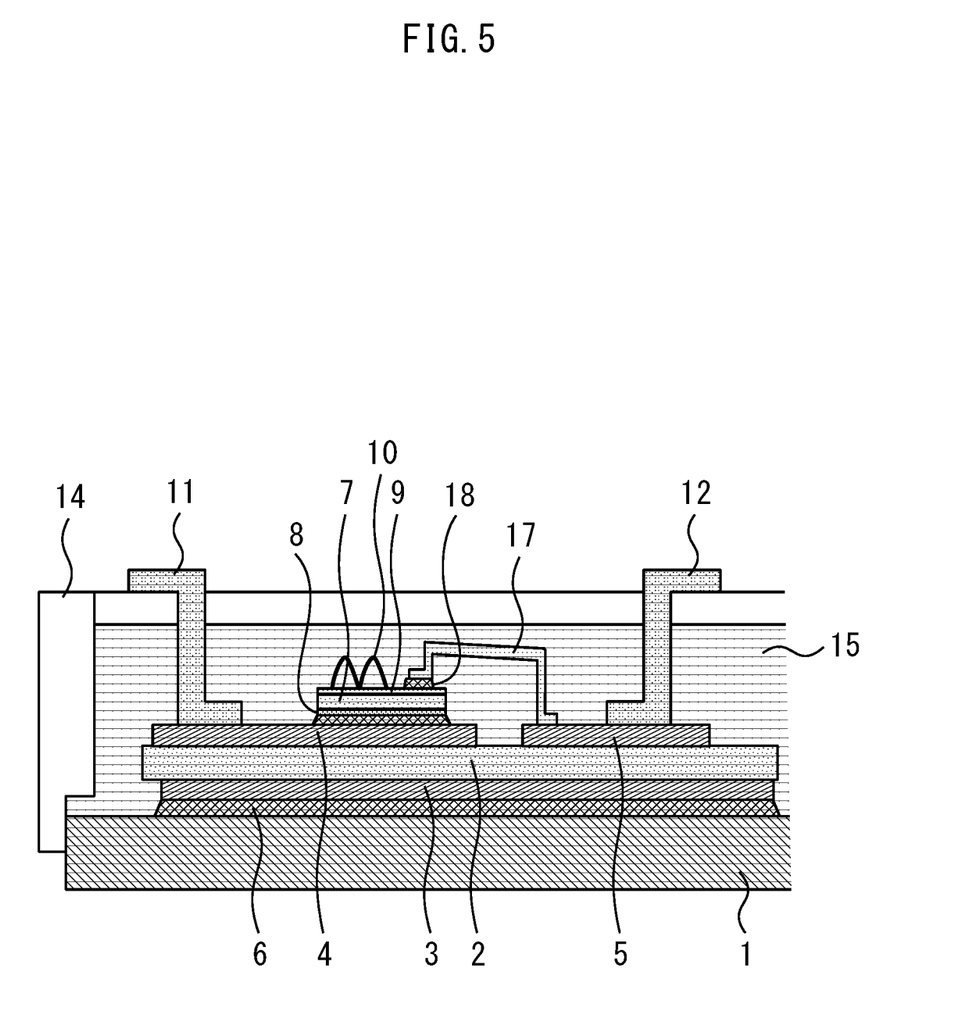
FIG. 5 is a cross-sectional view illustrating a semiconductor module according to Embodiment 4.

FIG. 5 is a cross-sectional view illustrating a semiconductor module according to Embodiment 4. The lead 11 is ultrasonic jointed to the circuit pattern 4, and the lead 12 is ultrasonic jointed to the circuit pattern 5. One end of the U-shaped lead 17 is jointed to the emitter electrode 9 of the semiconductor device 7 with the solder 18, and the other end is ultrasonic jointed to the circuit pattern 5. Other configurations are similar to those in Embodiment 1.

When the solder 18 melts, one end of the lead 17 is peeled from the semiconductor device 7 by residual stress in a similar manner to Embodiment 3. This can cut off an overcurrent. Further, it is possible to reduce portions of solder joint by ultrasonic jointing the other end of the lead 17. This enables high-temperature operation and can prevent lowering of life with respect to a heat cycle.

Here, in a case where one end of the lead 17 is thick or a heat sink is jointed to one end of the lead 17, even if the solder 18 melts, the lead 17 does not peel from the semiconductor device 7 by weight, so that an overcurrent cannot be cut off. In contrast, in the present embodiment, the lead 17 is one metal plate having a constant thickness from one end to the other end. Further, one end of the lead 17 is directly jointed to the emitter electrode 9 only through the solder 18, and a heat sink, or the like, does not exist between one end of the lead 17 and the emitter electrode 9. It is therefore possible to separate the lead 17 from the semiconductor device 7 upon melting of the solder 18.

The semiconductor device 7 is not limited to a semiconductor device formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

The semiconductor device 7 which is formed with a wide bandgap semiconductor is used at a high temperature. To address this, use of the configurations in Embodiment 1 to 4 enables higher reliability by maintaining characteristics as a semiconductor also in use at a high temperature and securing life of a jointed portion of the lead.

Fifth Embodiment

In this embodiment, the semiconductor modules according to the first to fourth embodiments described above are applied to an electric power conversion device. Although the present disclosure is not limited to a specific electric power conversion device, a case where the present disclosure is applied to a three-phase inverter will be described below as the fifth embodiment.

Figure 6:
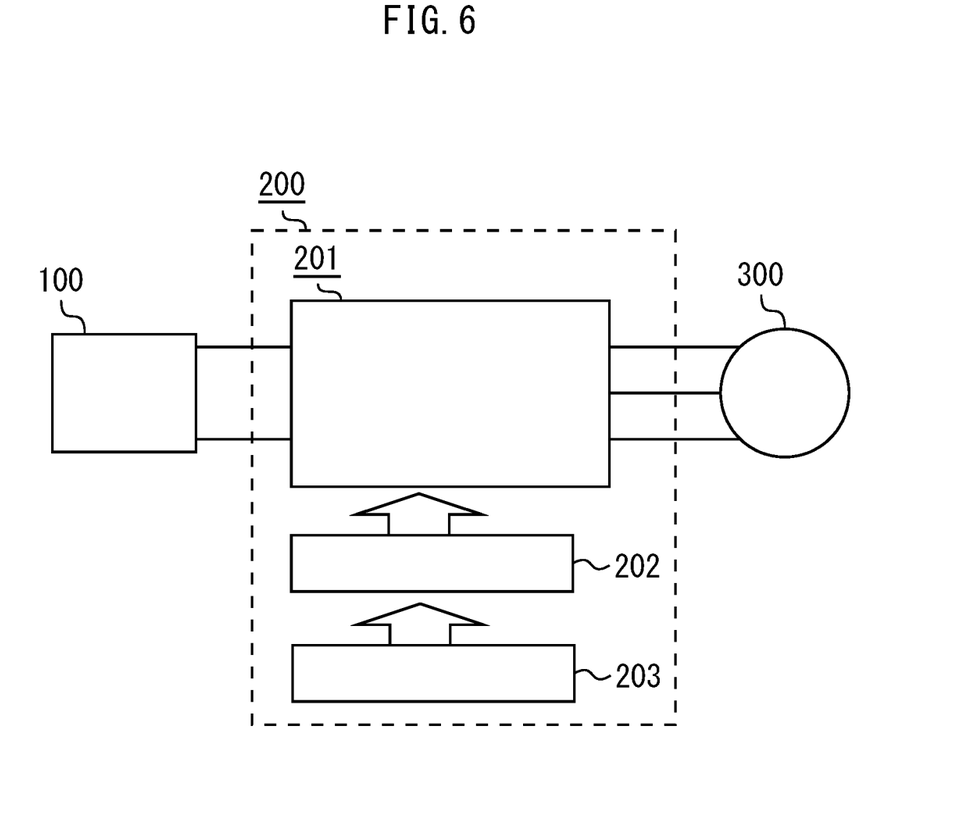
FIG. 6 is a block diagram illustrating a configuration of an electric power conversion system to which the electric power conversion device according to the fifth embodiment is applied.

FIG. 6 is a block diagram illustrating a configuration of an electric power conversion system to which the electric power conversion device according to the fifth embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, a drive circuit 202 outputting a drive signal for driving each switching device of the main conversion circuit 201, and a control circuit 203 outputting a control signal for controlling the drive circuit 202 to the drive circuit 202.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor module corresponding to any one of the first to fourth embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

The drive circuit 202 may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit 202 included in the main conversion circuit 201 so that the ON signal is output to each switching device to be turned on and an OFF signal is output to each switching device to be turned off at each point. The drive circuit 202 outputs the ON signal or OFF signal, as the drive signal, to the control electrode of each switching device according to the control signal.

In the electric power conversion device according to this embodiment, the semiconductor devices according to the first to fourth embodiments are applied as the semiconductor device of the main conversion circuit 201. Accordingly, a highly reliable power conversion device can be obtained. In addition, it is possible to reduce the power consumption of the cooler of the electric power conversion device.

While this embodiment illustrates an example in which the present disclosure is applied to a two-level three-phase inverter, the present disclosure is not limited to this and can be applied to various electric power conversion devices. While this embodiment illustrates a two-level electric power conversion device, the present disclosure can also be applied to a three-level or multi-level electric power conversion device. When power is supplied to a single-phase load, the present disclosure may be applied to a single-phase inverter. The present disclosure can also be applied to a DC/DC converter or an AC/DC converter when power is supplied to a DC load or the like.

Further, in the electric power conversion device to which the present disclosure is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

Embodiment 6

Figure 7:
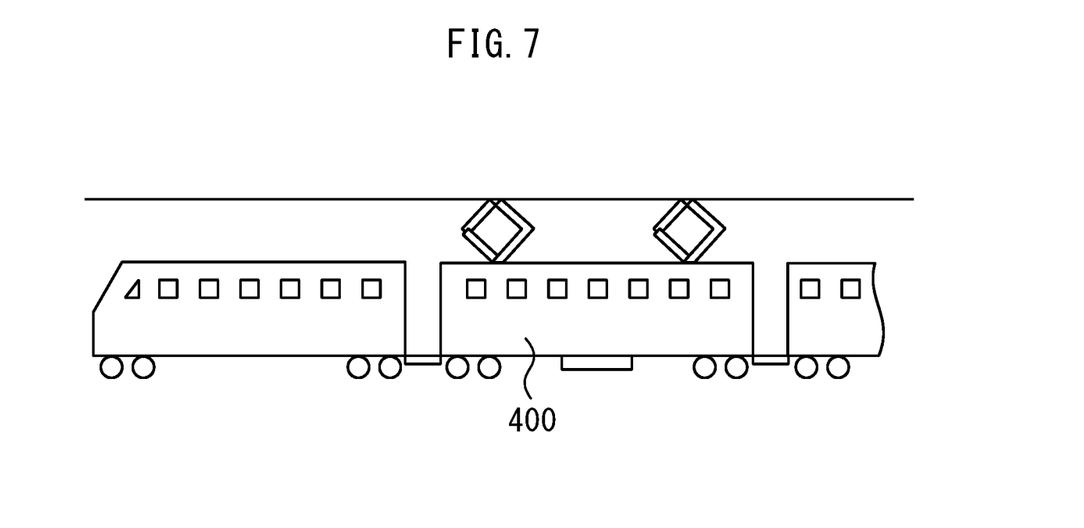
FIG. 7 is a view illustrating a moving body according to Embodiment 6.

FIG. 7 is a view illustrating a moving body according to Embodiment 6. A moving body 400 is a railroad vehicle including the power conversion apparatus 200 according to Embodiment 5. The moving body 400 can move using output from the power conversion apparatus 200. Improvement in reliability of the power conversion apparatus 200 can also improve reliability of the moving body 400. Further, reduction of power consumption of the power conversion apparatus 200 reduces a maintenance cycle of the moving body 400, which achieves longer life. Note that the moving body 400 is not limited to the railroad vehicle and may be, for example, a hybrid vehicle, an electric vehicle, an elevator, or the like.

REFERENCE SIGNS LIST 2 insulated substrate; 4,5,16 circuit pattern; 7 semiconductor device; 8 collector electrode; 9 emitter electrode; 11 lead; 12 lead; 13,18 solder; 17 lead; 100 power supply; 200 electric power conversion device; 201 main conversion circuit; 202 drive circuit; 203 control circuit; 300 load; 400 moving body

The invention claimed is:

1. A semiconductor module comprising:
an insulated substrate including first and second circuit patterns;
a semiconductor device including first and second main electrodes connected to the first and second circuit patterns respectively and through which main currents flow;
a first lead solder jointed to the first circuit pattern;
a second lead ultrasonic jointed to the second circuit pattern; and
a case surrounding the semiconductor device, wherein
the first lead and the second lead each extend outside the case,
the first lead includes: a first portion extending in a first direction from the first circuit pattern to the case, a bend that bends from the first direction to a second direction; a second portion that is past the bend and outside the case extending in the second direction, the second portion directly contacting an external surface of the case; and a third portion inside the case, the third portion being solder jointed to the first circuit pattern, the third portion extending from the first portion in the second direction, and
the second portion and the third portion extend from the first portion in opposite directions.

2. The semiconductor module according to claim 1, further comprising a base plate jointed to a lower surface of the insulated substrate,
the first lead is a high-voltage side terminal, and
the second lead is a low-voltage side terminal.

3. The semiconductor module according to claim 1, wherein the semiconductor device is made of a wide-bandgap semiconductor.

4. An electric power conversion apparatus comprising:
a main conversion circuit including the semiconductor module according to claim 1, converting input power and outputting converted power;
a drive circuit outputting a drive signal for driving the semiconductor module to the semiconductor module; and
a control circuit outputting a control signal for controlling the drive circuit to the drive circuit.

5. A moving body comprising the power conversion apparatus according to claim 4.

6. The semiconductor module according to claim 1, further comprising a control electrode.

7. The semiconductor module according to claim 1, wherein when the main currents flow, the main currents flow between the first lead and the second lead.

8. The semiconductor module according to claim 1, wherein if the solder jointing the first lead to the first circuit pattern melts, the first lead and the first circuit pattern are separated from each other.

* * * * *